United States Patent [19]

Sheu et al.

[11] Patent Number: 5,646,059

[45] Date of Patent: Jul. 8, 1997

[54] PROCESS FOR FABRICATING NON-VOLATILE MEMORY CELLS HAVING IMPROVED VOLTAGE COUPLING RATIO BY UTILIZING LIQUID PHASE

[75] Inventors: Yau-Kae Sheu; Gary Hong, both of Hsinchu, Taiwan

[73] Assignee: United Microelectronics Corporation, Hsinchu, Taiwan

[21] Appl. No.: 422,876

[22] Filed: Apr. 17, 1995

[51] Int. Cl.$^6$ .................................................. H01L 21/8247
[52] U.S. Cl. ................................. 437/43; 437/44; 437/239
[58] Field of Search ............................ 437/42, 43, 44, 437/191, 238, 239

[56] References Cited

U.S. PATENT DOCUMENTS

| 5,270,233 | 12/1993 | Hamatake | 437/44 |
| 5,432,112 | 7/1995 | Hong | 437/43 |
| 5,489,542 | 2/1996 | Iwai et al. | 437/42 |

*Primary Examiner*—Chandra Chaudhari
*Attorney, Agent, or Firm*—Ladas & Parry

[57] ABSTRACT

A process for fabricating non-volatile memory cells having improved voltage coupling ratio by utilizing liquid phase deposition. Polysilicon spacers resulting from the liquid phase deposition increase the surface area of the dielectric layer between floating gate and control gate layers.

10 Claims, 9 Drawing Sheets

PROCESS FOR FABRICATING NON-VOLATILE MEMORY CELLS HAVING IMPROVED VOLTAGE COUPLING RATIO BY UTILIZING LIQUID PHASE

BACKGROUND OF THE INVENTION

1. Field of the Invention

The present invention relates in general to a process for fabrication of non-volatile memory cells. In particular, the present invention relates to a process for fabrication of non-volatile memory cells having improved voltage coupling ratio. More particularly, the present invention relates to a process for fabrication of non-volatile memory cells having improved voltage coupling ratio by utilizing liquid phase deposition to introduce polysilicon spacers onto the floating gates of non-volatile memory cells.

2. Technical Background

Conventional non-volatile semiconductor memory cells normally require high voltage for effecting writing and erasing operation to the memory cells. The writing and erasing voltages are considered high when compared to their normal read operation voltage, typically set at 3 to 5 volts. A typical write/erase voltage for EPROM devices is 12V, while for EEPROM it is about 18–22V. A high voltage coupling ratio is, in turn, needed to support such high operating voltage for writing and erasing operations.

Conventional non-volatile memory cell fabrication techniques incorporate photomasking as part of the fabrication process. However, precision alignment during the photomasking process is vital in the fabrication of present-day high capacity memory devices. Such precision alignment is considered relatively difficult to implement due to the finer resolution requirements in the fabrication of high density memory devices. Precision photomasking process steps, which add to the process time requirement, therefore represents increased cost for the fabrication of semiconductor devices. Thus, it is always desirable to reduce, or even avoid, the use of photomasking process steps during semiconductor fabrication procedures.

A typical prior art process for fabricating non-volatile memory cells is explained below with reference to the sets of FIGS. 1a–1d and 2a–2e together. FIGS. 1a–1d show the layout of the non-volatile memory cell, and FIGS. 2a–2e show the same non-volatile memory cell but with selected cross sections from related stages of the fabrication procedure. For example, active region 100 as seen in FIG. 1a is defined on a substrate for the memory device, designated as reference numeral 10 in FIG. 2a, in which FIG. 2a is the view of the cross section taken along the 2a—2a line in FIG. 1a.

Active region 100 is defined on substrate 10. An oxide layer with a thickness of about 300–500 Å and a nitride layer of about 1,500–2,000 Å are subsequently formed on substrate 10. A thermal oxidation procedure is then performed to form field oxide layer 30 in the area on substrate 10 excluding active region 100. The oxide and nitride layers are then removed, and channel oxide layer 20 is formed on active region 100 to obtain the structure shown in the cross-sectional view of FIG. 2a. For flash memories, the thickness of channel oxide layer 20 is about 100 Å, while for typical EPROMs, this thickness is about 200 Å.

Next, referring to FIGS. 1b and 2b concurrently, in which FIG. 2b is the cross section taken along the 2b—2b line in FIG. 1b, a first polycide layer with a thickness of about 1,500–2,000 Å is then deposited, and a region for floating gate 40 is defined out of the first polycide layer as indicated by shaded-line area 40 shown in FIG. 1b, as well as indicated by shaded-line portion 40 in FIG. 2b. A relatively thinner layer of dielectric material 50 with a thickness of about 100–250 Å is then formed thereon. The dielectric material can be a typical oxide/nitride/oxide structure.

Then, referring to FIGS. 1c and 2c, in which FIG. 2c is again the cross section taken along the 2c—2c line in FIG. 1c, a second polycide layer with a thickness of about 2,000 Å is formed thereon and followed by the formation of an electrically conductive metal silicide layer with a thickness of about 1,500–2,000 Å. A photomasking procedure is then implemented by first applying layer of photoresist 61 covering the second polycide and metal silicide layers. Exposure and subsequent processing applied to the layer of photoresist 61 define the contour for control gate 60 of the memory cell being fabricated. This results in the structural configuration as shown by dot-filled area 60 in the layout view of FIG. 1c, as well as being indicated by dot-filled area 60 of FIG. 2c.

Next, referring to FIGS. 1d and 2d, with the cross-sectional view of FIG. 2d taken along the 2d—2d line in FIG. 1d, an etching process is performed before the layer of photoresist is removed to etch away the portions of dielectric layer 50 and floating gate 40 not being covered by photoresist 61. After this etching, photoresist layer 61 is removed and obtain source region 70 and drain region 80 for the memory cell. This can be observed as seeing the floating gate layer being designated by shaded-line portion 41 in FIG. 1d. A view showing the cross section of the completed non-volatile memory cell as shown in FIG. 2d, with another cross-sectional view taken along the 2e—2e line in FIG. 1d, is shown in FIG. 2e to reveal the structural configuration of the non-volatile memory cell from another direction.

FIG. 3 is a schematic diagram of the equivalent circuit of a non-volatile memory cell showing the effect of equivalent capacitance established in the cell structural configuration, which includes a channel oxide 20, a floating gate 40, a dielectric layer 50, a control gate 60, a drain D, a source S and a base B. When a non-volatile memory cell is activated by applying appropriate voltages to the relevant terminals of the device, there will be capacitance $C_1$ established between floating gate layer 40 and control gate layer 60 of the conventional non-volatile memory cell. A reference to the cross-sectional views FIGS. 2d and 2e, of the completed fabrication of a non-volatile memory cell, indicates that capacitance $C_1$ is across dielectric layer 50. There is also another capacitance $C_2$ established across channel oxide layer 20. If the voltage applied to control gate 60 is $V_1$, while the voltage to floating gate 40 is $V_2$, there exists a relationship between the voltages and capacitances as follows:

$$V_1 = [C_1/(C_1 + C_2)]V_2$$

Based on the characteristic of the above expression, a larger $C_1$ implies a larger coupling ratio for the voltages. In other words, a larger $C_1$ enables the reduction in the voltage required by the non-volatile memory cell for the data bit writing and erasing operation. The reduced writing/erasing voltage in turn enables the simplification of the peripheral circuitry for the memory cell that supports the writing/erasing operation of the memory device.

SUMMARY OF THE INVENTION

It is therefore an object of the present invention to provide an improved process for fabricating non-volatile memory cells having an improved voltage coupling ratio without increasing the number of photomasking procedures during fabrication.

A process for fabricating non-volatile memory cell is provided that employs liquid phase deposition to introduce polysilicon spacers onto the floating gates of non-volatile memory cells to increase the surface area for the equivalent capacitor pole plane, which is the surface area of the dielectric layer between the floating gate and the control gate layers.

An active region of the non-volatile memory cell is defined on a substrate. Field oxide layers are formed in the area except for the active region on the substrate. A channel oxide layer is formed on the active region. A first polycide layer is formed and a photoresist layer is subsequently formed on the substrate. A photomasking procedure is applied to contour the photoresist layer on the region of floating gate so as to define the first polycide as the floating gate. Liquid phase deposition is used to deploy an oxide layer on the region uncovering by the photoresist layer, in which the thickness of the oxide layer is larger than that of the floating gate. The photoresist layer is removed and a second polycide layer is deployed. The second polycide layer is etched back to form polysilicon spacers on sidewalls of the oxide layer and above the floating gate. The oxide layer is removed and a dielectric layer is formed. An electrically conducting layer is then formed.

The present invention thereby achieves the object of improving voltage coupling ratio for the non-volatile memory cell by increasing capacitor capacitance without increasing the complexity of device fabrication.

Other objects, features and advantages of the present invention will become apparent by way of the following detailed description of the preferred but non-limiting embodiment.

BRIEF DESCRIPTION OF THE DRAWINGS

The detailed description is made with reference to the accompanying drawings, wherein.

In all the Figures, like reference numeral represents the same or similar component of the non-volatile memory cell utilized for the description of the present invention.

DETAILED DESCRIPTION OF THE PREFERRED EMBODIMENT

Figure 4:
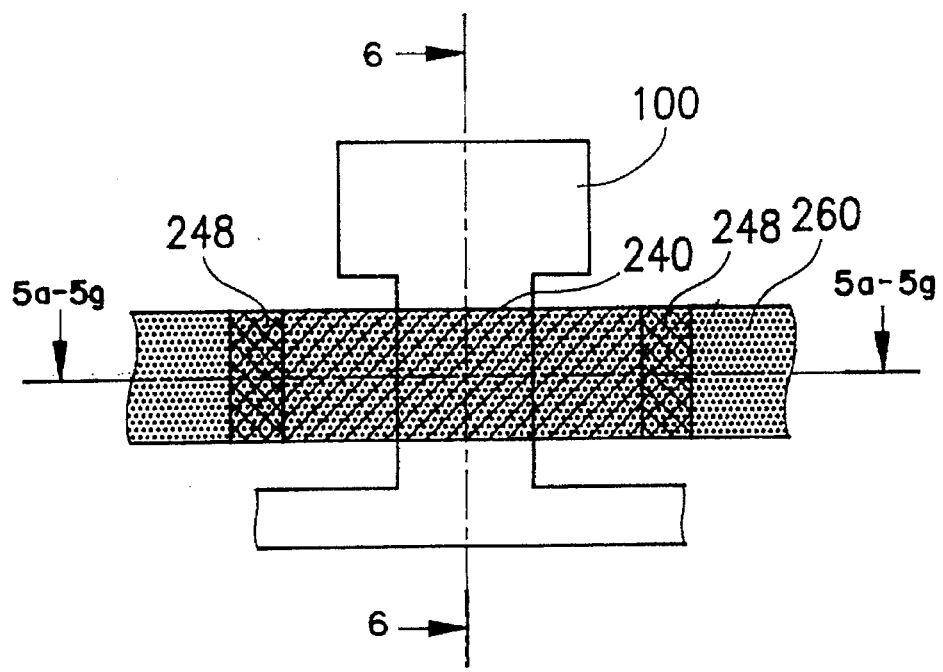
FIG. 4 shows the layout of a non-volatile memory cell according to a preferred embodiment of the present invention.

Reference is now made to FIGS. 4 and 5a–5g. FIG. 4 shows the layout of the non-volatile memory cell fabricated in accordance with a preferred embodiment of the present invention, and FIGS. 5a–5g show the cross sections of the same non-volatile memory cell during selected stages of the fabrication procedure. The cross sections are selected from the appropriate process stages exhibiting the characteristics of the fabricating procedure of the present invention. The views in FIGS. 5a—5g are taken along the direction indicated by the line 5a–5g of FIG. 4. The view in FIG. 6 is taken along the direction indicated by the line 6 of FIG. 4.

The fabrication process as employed in the preferred embodiment of the present invention outlined in FIGS. 5a–5f is described below. First, active region 100 as seen in FIG. 4 is defined on a substrate for the memory device, designated as reference numeral 210 in FIG. 5a. Active region 100 is defined on substrate 210. An oxide layer and an insulating nitride layer are formed subsequently on substrate 210. A photomasking procedure defines a contour in the nitride layer on top of the channel region for the non-volatile memory cell to be fabricated. A thermal oxidation process is then applied to form field oxide layer 230 for the cell in the area of substrate 210 not being covered by the nitride layer. Thereafter, the oxide and nitride layers are removed before channel oxide layer 220 having a thickness of 75–100 Å is formed above the channel region of the memory cell.

Figure 5A:
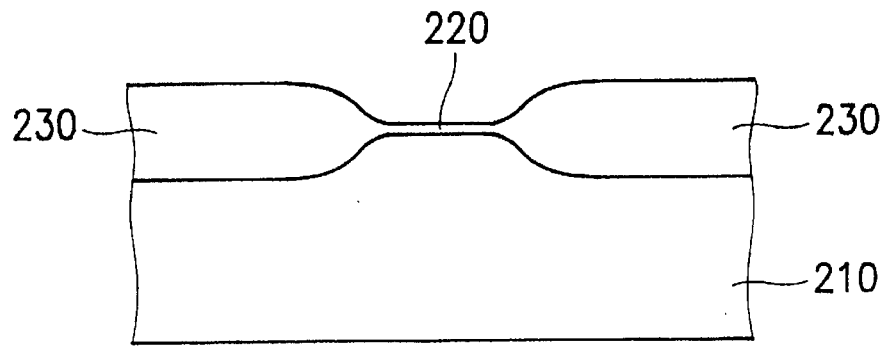
FIGS. 5a–5g show the cross sections of the non-volatile memory cell according to the preferred embodiment of the present invention during selected stages in the process of fabrication.
Figure 5B:
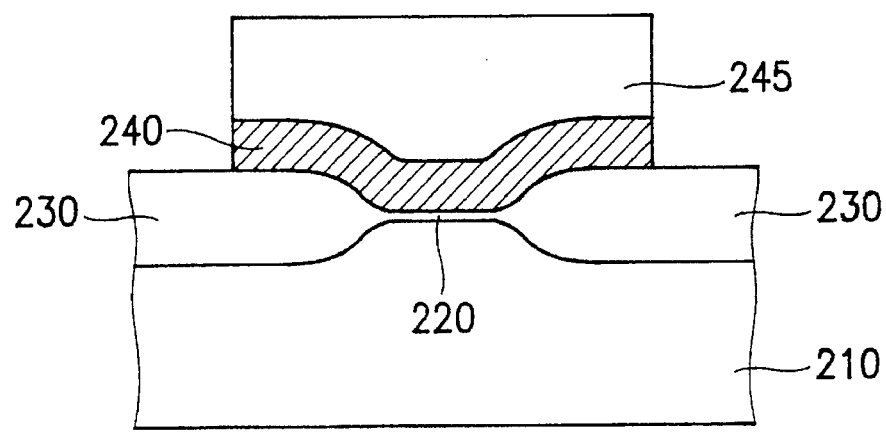
Figure 6:
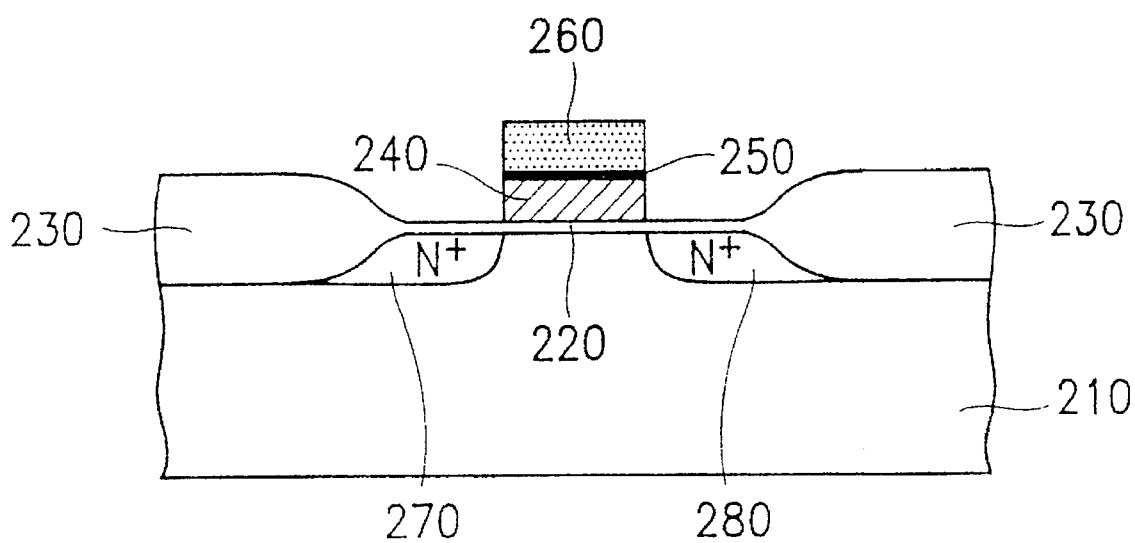
FIG. 6 shows another cross section of the completed non-volatile memory cell shown in FIG. 5g, which is taken along the 6 line in FIG. 4 to reveal the structural configuration of the non-volatile memory cell.

Referring next to FIG. 5b, a first polycide layer and a photoresist layer are formed subsequently, with the thickness of the first polycide layer being in the range of 1,500–3,000 Å. Then, a photomask process is employed to contour the photoresist layer on the first polycide layer for defining the floating gate region of the memory cell. Then, an etching procedure is applied to etch away a portion of the first polycide layer in the area not being covered by photoresist layer 245. The result of this etching procedure forms floating gate 240 of the memory cell with photoresist layer 245 formed thereon.

Figure 5C:
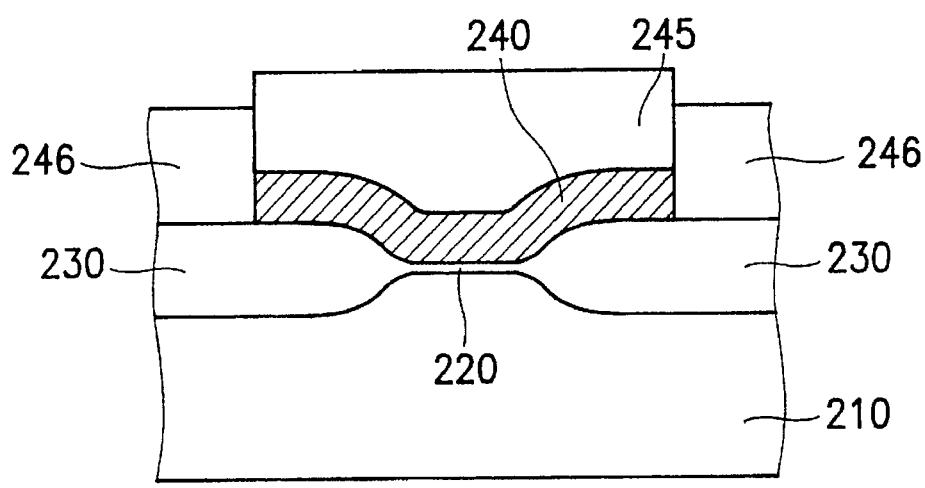

Refer next to the process stage shown in FIG. 5c. A liquid phase deposition(LPD) is employed to deposit layer of oxide 246 on the region not being covered by photoresist layer 245. As seen in FIG. 5c, the thickness of oxide layer 246 is controlled to be larger than the thickness of floating gate 240, e.g., 3,000–6,000 Å.

Since LPD has a relatively good deposition selectivity, silicon dioxide ($SiO_2$) will only deposit on silicon dioxide or polysilicon, not on other materials such as silicon, tungsten, or photoresist. Thus, a photomask process needed for forming the polysilicon spacers above the floating gate in conventional process stages of a non-volatile memory cell can be reduced. This also reduces the initial cost of a non-volatile memory cell.

Figure 5D:
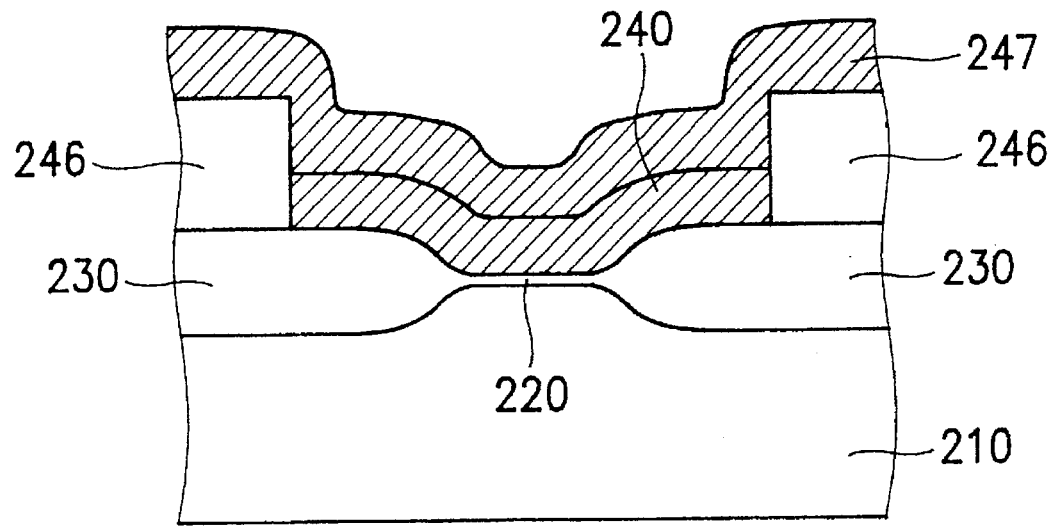
Figure 5E:
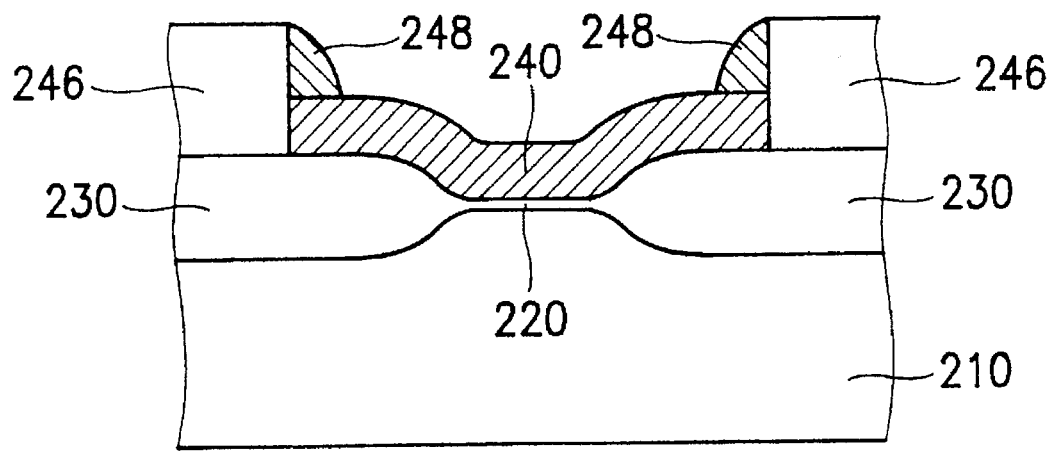

Referring to the cross-sectional view of FIG. 5d, photoresist layer 245 is then removed. Afterwards, second polycide layer 247 is formed thereon. After the deposition of second polycide layer 247, an etch-back procedure (e.g., plasma etching or reactive-ion etching (RIE)) is used to etch second polycide layer 247 to form polysilicon spacers 248 on sidewalls of oxide layer 246 as shown in FIG. 5e.

Figure 5F:
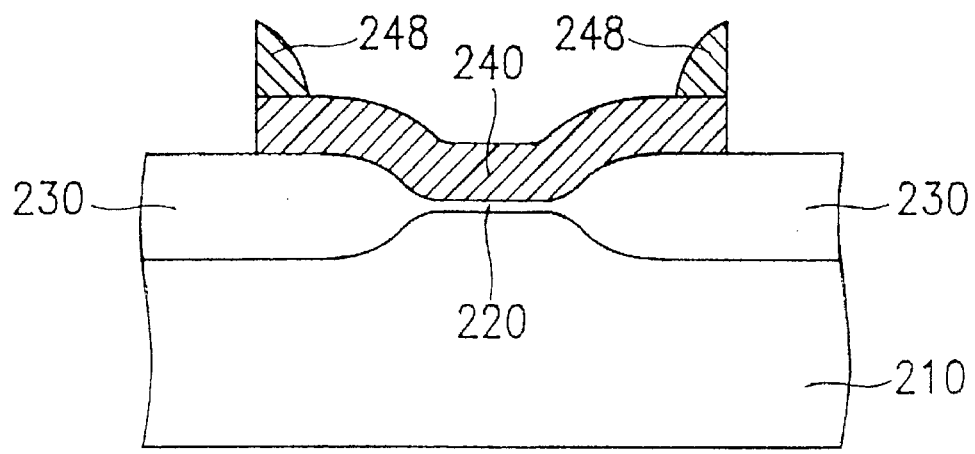

Referring now to FIG. 5f, oxide layer 246 is removed, e.g., by a wet etching procedure, and polysilicon spacers 248 is left on floating gate 240.

Figure 5G:
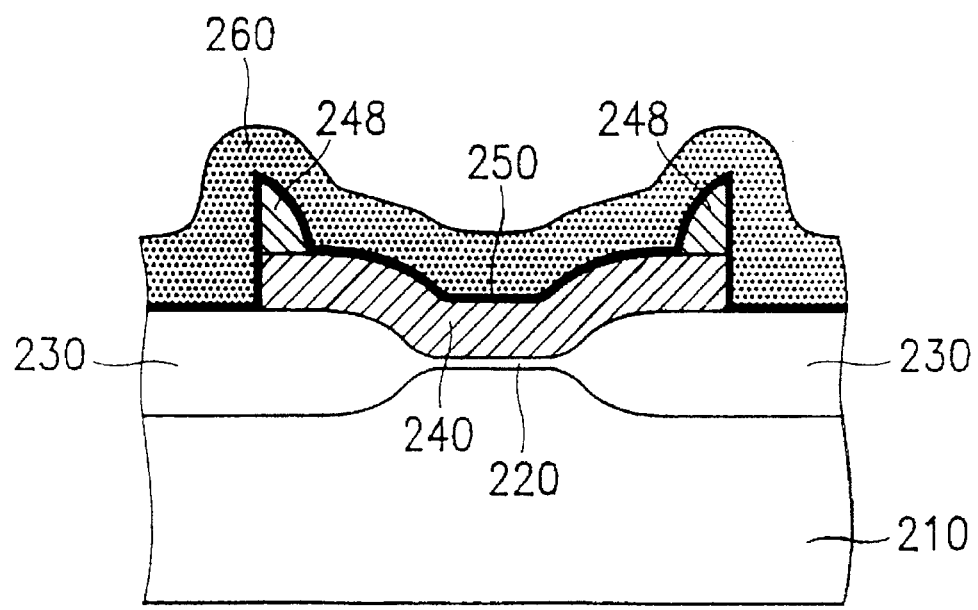

Thereafter, referring to FIG. 5g, a layer of dielectric material 250, having the structural configuration of, for example, oxide/nitride/oxide, and a thickness of about 100–250 Å is then formed thereon. As can be seen in FIG. 5g, polysilicon spacers 248 increase the surface area and curves of dielectric layer 250.

Figure 1A:
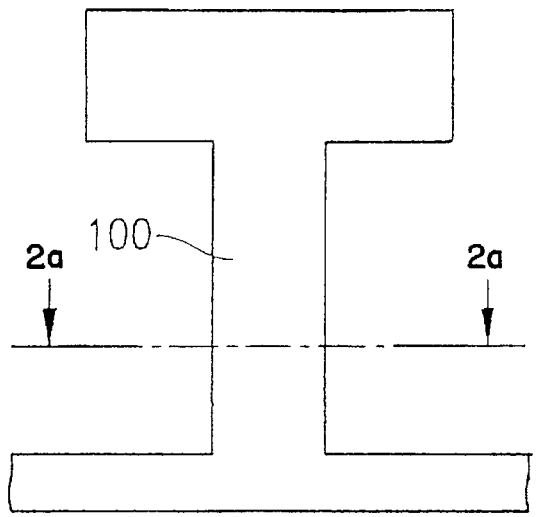
FIGS. 1a–1d show the layout of a conventional non-volatile memory cell during selected stages in its fabrication process.
Figure 1B:
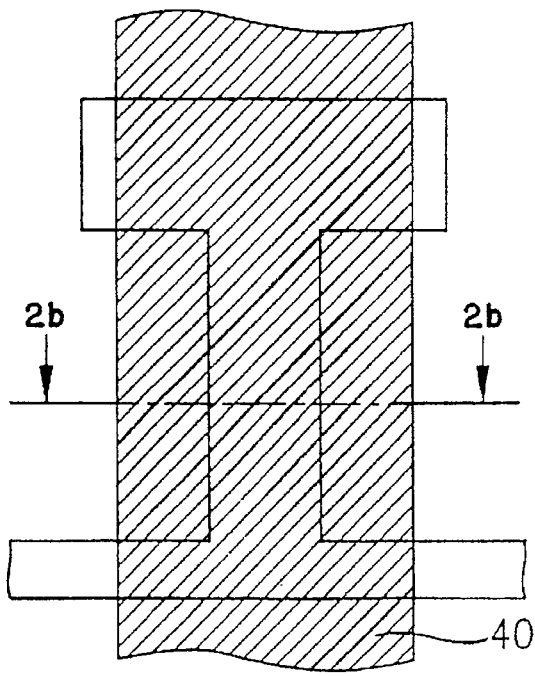
Figure 1C:
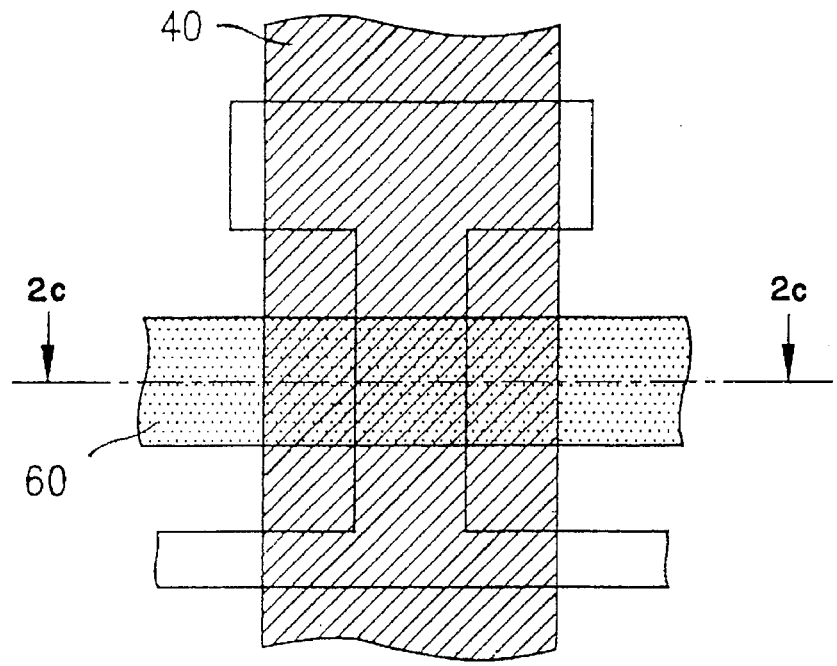
Figure 1D:
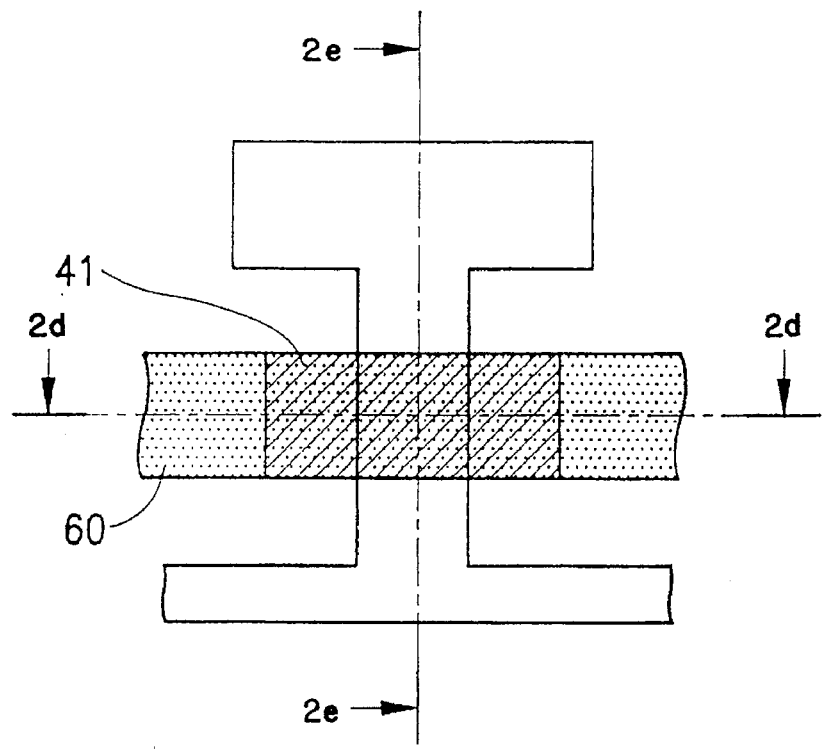
Figure 2A:
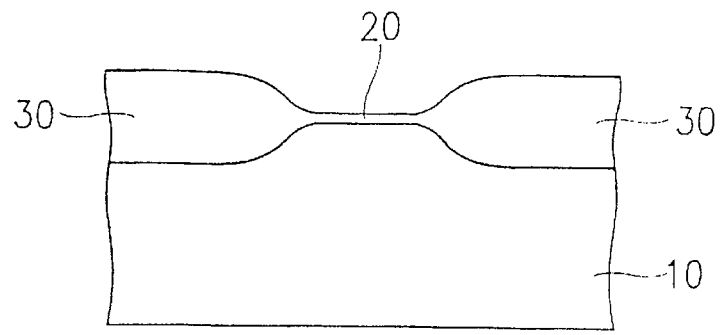
FIGS. 2a–2e show the cross sections of the conventional non-volatile memory cell of FIGS. 1a–1d during related stages in its fabrication process.
Figure 2B:
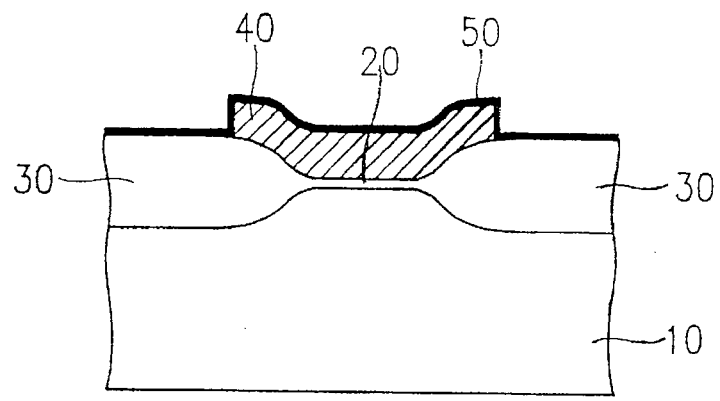
Figure 2C:
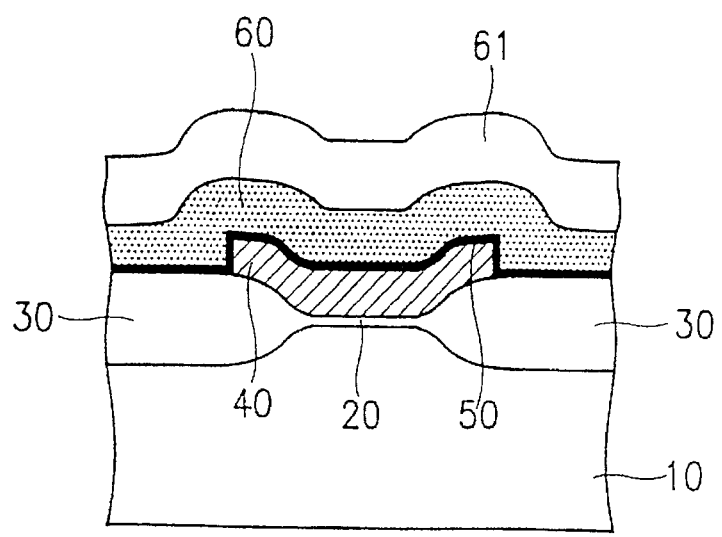
Figure 2D:
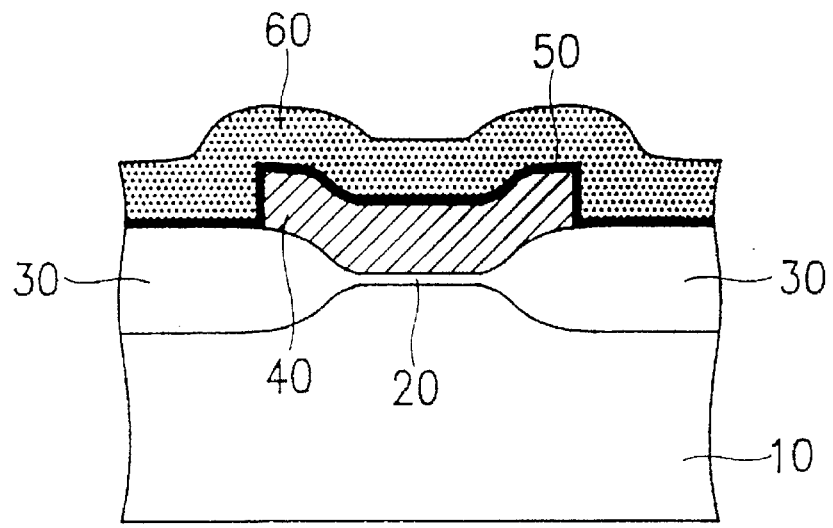
Figure 2E:
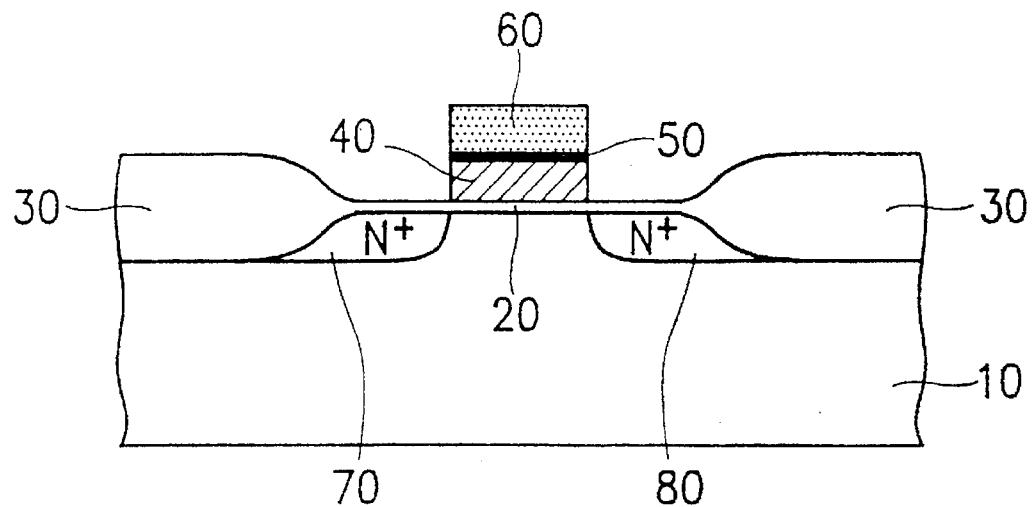
Figure 3:
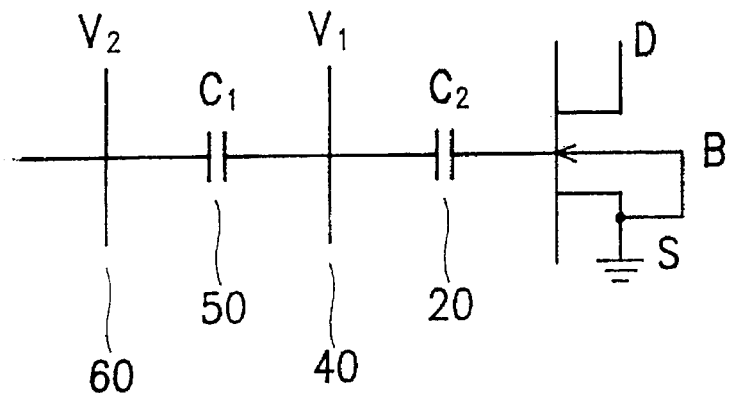
FIG. 3 is a schematic diagram of the equivalent circuit of a non-volatile memory cell showing the effect of equivalent capacitance.

Then, a third polycide layer with a thickness of about 2,000 Å is formed on the dielectric layer and an electrically conductive metal silicide with a thickness of about 1,500–2,000 Å is formed on the third polycide layer, which are then subjected to fabrication process steps, as the steps described for the control gate 60 in FIG. 2d, for forming control gate 260 for the non-volatile memory cell. A view showing the cross section of the completed non-volatile memory cell of this invention is shown in FIG. 5g, with another cross-sectional view taken along the 6 line in FIG. 4 shown in FIG. 6 to reveal the structural configuration of the non-volatile memory cell from another direction.

The fabrication procedures for the making of source 270 and drain 280 for the non-volatile memory cell are not described in specific detail. That is because, as persons skilled in this art already being familiar with, they are known techniques in this art and are not included in the inventive scope of the present invention.

Generally speaking, the coupling ratio of a conventional non-volatile memory cell is in a range of 0.5 to 0.6. However, the coupling ratio of the non-volatile memory cell is normally in a range of 0.65 to 0.75 and even larger than 0.75 dependent on the height of the polysilicon spacers according to the present invention.

Although the present invention of the process for fabrication of non-volatile memory cell having improved voltage coupling ratio has been described based on the category of non-volatile memory, one specific type of the non-volatile, it is, however, apparent to persons skilled in the art that the present invention is not limited to non-volatile memory devices. Modifications to the exemplified material and process conditions can be made without departing from the scope of the disclosed invention which is defined in the following claims.

We claim:

1. A process for fabricating a non-volatile memory cell having improved voltage coupling ratio, comprising the steps of:

(a) defining an active region of said non-volatile memory cell on a substrate;

(b) forming field oxide layers in an area on said substrate except for the active region;

(c) forming a channel oxide layer on the active region;

(d) forming a first polycide layer on said channel oxide layer and said field oxide layers and forming a photoresist layer on said first polycide layer;

(e) applying a photomasking procedure to contour said photoresist layer on a floating gate region of said active region so as to define said first polycide layer as a floating gate of said non-volatile memory cell, said floating gate having a floating gate thickness;

(f) depositing a liquid phase deposited oxide layer on a region of said field oxide layers not covered by said photoresist layer, said liquid phase deposited oxide layer having a liquid phase deposited oxide layer thickness larger than said floating gate thickness;

(g) removing said photoresist layer, and depositing a second polycide layer on said liquid phase deposited oxide layer and said first polycide layer;

(h) etching back said second polycide layer to form polysilicon spacers at sidewalls of said liquid phase deposited oxide layer and on said floating gate;

(i) removing said liquid phase deposited oxide layer and forming a dielectric layer on said polysilicon spacers and on said floating gate; and (j) forming an electrically conducting layer on said dielectric layer.

2. The process for fabricating a non-volatile memory cell of claim 1 wherein the step of forming an electrically conducting layer includes the step of fabricating a third polycide layer on said dielectric layer and a metal silicide layer on said third polycide layer.

3. The process for fabricating a non-volatile memory cell of claim 1 wherein the thickness of said first polycide layer is in the range of about 1,500 to 3,000 Å.

4. The process for fabricating a non-volatile memory cell of claim 1 wherein the thickness of said oxide layer formed in step (f) is in the range of about 3,000 to 6,000 Å.

5. The process for fabricating a non-volatile memory cell of claim 1, wherein the thickness of said channel oxide layer is in the range of 75 to 100 Å.

6. A method for fabricating a non-volatile memory cell having improved voltage coupling ratio, comprising the steps of:

defining a channel region on a substrate;

locating source and drain regions at opposing sides of said channel region;

forming a channel oxide layer above said channel region;

forming a polycide layer above said channel oxide layer;

forming a dielectric layer above said polycide layer;

forming polysilicon spacers onto said polycide layer to increase the surface area of said dielectric layer; and forming an electrically conducting layer above said dielectric layer.

7. The method for fabricating a non-volatile memory cell of claim 6 wherein the step of forming polysilicon spacers includes the step of forming polysilicon spacers to increase curves in said dielectric layer.

8. The method for fabricating a non-volatile memory cell of claim 6 wherein said polycide layer forms a floating gate.

9. The method for fabricating a non-volatile memory cell of claim 6 wherein said electrically conducting layer forms a control gate.

10. The method for fabricating a non-volatile memory cell of claim 6 wherein the step of forming polysilicon spacers includes the step of using liquid phase deposition to form a liquid phase deposition layer, said liquid phase deposition layer forming sidewalls for said polysilicon spacers.

* * * * *